(12) United States Patent
Yamada et al.

(10) Patent No.: US 9,812,377 B2
(45) Date of Patent: Nov. 7, 2017

(54) SEMICONDUCTOR MODULE AND INVERTER DEVICE

(71) Applicant: MITSUBISHI ELECTRIC CORPORATION, Chiyoda-ku, Tokyo (JP)

(72) Inventors: Takayuki Yamada, Tokyo (JP); Noriyuki Besshi, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 0 days.

(21) Appl. No.: 14/911,661

(22) PCT Filed: Jul. 31, 2014

(86) PCT No.: PCT/JP2014/004027
§ 371 (c)(1),
(2) Date: Feb. 11, 2016

(87) PCT Pub. No.: WO2015/033515
PCT Pub. Date: Mar. 12, 2015

(65) Prior Publication Data
US 2016/0197028 A1    Jul. 7, 2016

(30) Foreign Application Priority Data
Sep. 4, 2013   (JP) .................. 2013-183224

(51) Int. Cl.
*H01L 23/473* (2006.01)
*H01L 25/07* (2006.01)
*H01L 23/373* (2006.01)

(52) U.S. Cl.
CPC .......... *H01L 23/473* (2013.01); *H01L 25/072* (2013.01); *H01L 23/3735* (2013.01); *H01L 2224/32225* (2013.01)

(58) Field of Classification Search
CPC ................. H01L 25/072; H01L 23/473; H01L 2224/32225; H01L 23/3735
(Continued)

(56) References Cited

U.S. PATENT DOCUMENTS 4,415,025 A * 11/1983 Horvath .............. H01L 23/3672
165/185
5,006,924 A * 4/1991 Frankeny ................ H01L 23/42
165/46
(Continued)

FOREIGN PATENT DOCUMENTS

JP    10-189845 A    7/1998
JP    11-265976 A    9/1999
(Continued)

OTHER PUBLICATIONS

International Search Report (PCT/ISA/210) issued on Oct. 7, 2014, by the Japanese Patent Office as the International Searching Authority for International Application No. PCT/JP2014/004027.
(Continued)

*Primary Examiner* — Anatoly Vortman
(74) *Attorney, Agent, or Firm* — Buchanan Ingersoll & Rooney PC (57) ABSTRACT

In a semiconductor module of the invention, a heat sink has a convex portion in which a convex plane has an area smaller than a joint area to the joint layer, a first stepped portion provided to an edge of the convex portion, a thickness of the heat sink in a portion corresponding to the first stepped portion being smaller than a thickness of the heat sink in a portion corresponding to the convex portion, and a second stepped portion provided to an edge of the first stepped portion, a thickness of the heat sink in a portion corresponding to the second stepped portion being further smaller than the thickness of the heat sink in the portion corresponding to the first stepped portion. The joint layer is
(Continued)

joined by the convex portion and the first stepped portion of the heat sink.

7 Claims, 8 Drawing Sheets

(58) Field of Classification Search
USPC .......................................................... 361/712
See application file for complete search history.

(56) References Cited

U.S. PATENT DOCUMENTS

| | | | | |
|---|---|---|---|---|
| 6,251,707 | B1* | 6/2001 | Bernier | H01L 21/563 |
| | | | | 438/118 |
| 6,351,384 | B1* | 2/2002 | Daikoku | F28F 3/02 |
| | | | | 165/80.3 |
| 6,992,382 | B2* | 1/2006 | Chrysler | H01L 23/473 |
| | | | | 257/706 |
| 7,204,298 | B2* | 4/2007 | Hodes | F28F 3/048 |
| | | | | 165/80.4 |
| 7,254,030 | B2* | 8/2007 | Chiba | H01L 23/473 |
| | | | | 361/710 |
| 7,365,981 | B2* | 4/2008 | Myers | H01L 23/473 |
| | | | | 165/80.4 |
| 2013/0135824 | A1* | 5/2013 | Harubeppu | H01L 23/34 |
| | | | | 361/709 |
| 2014/0293548 | A1* | 10/2014 | Besshi | H01L 23/3107 |
| | | | | 361/715 |

FOREIGN PATENT DOCUMENTS

| | | | |
|---|---|---|---|
| JP | 2005-353945 | A | 12/2005 |
| JP | 2009-070907 | A | 4/2009 |
| JP | 2009-094264 | A | 4/2009 |
| JP | 2013-115297 | A | 6/2013 |
| JP | 2013-123016 | A | 6/2013 |

OTHER PUBLICATIONS

Written Opinion (PCT/ISA/237) issued on Oct. 7, 2014, by the Japanese Patent Office as the International Searching Authority for International Application No. PCT/JP2014/004027.

Office Action dated Jun. 14, 2016, by the Japanese Patent Office in corresponding Japanese Patent Application No. 2015-535298 and English translation of the Office Action. (11 pages).

Office Action dated Jun. 15, 2017 in corresponding Korean Patent Application No. 10-2016-7005865, and an English translation thereof.

* cited by examiner

SEMICONDUCTOR MODULE AND INVERTER DEVICE

TECHNICAL FIELD

The present invention relates to a semiconductor module which forms a circuit by using a ceramic circuit board having a conductor layer and to an inverter device employing a semiconductor module.

BACKGROUND ART

In a semiconductor module in the related art, after a ceramic circuit board provided with semiconductor elements is joined to a heat sink via a joint layer, such as solder, strain concentration caused by thermal stress occurs at an edge of the joint layer when the temperature is restored to normal temperature from a high temperature at the time of joint. In order to ease the strain concentration, the heat sink is provided with a convex portion having an area smaller than a joint area to the joint layer (see, for example, JP-A-11-265976). Owing to this configuration, strain concentration is eased by increasing a thickness of the joint layer at the edge where the strain concentration occurs.

SUMMARY OF INVENTION

Technical Problem

In the semiconductor module in the related art, strain concentration occurring at the edge of the joint layer is eased. However, warpage can still occur in the heat sink when the temperature is restored to a normal temperature from a high temperature at the time of joining due to a difference of linear expansion coefficients. Once the heat sink warps, it becomes necessary to correct warpage of the heat sink before a casing used to flow a refrigerant (refrigerant-channel forming casing) is firmly fixed to the edge of the heat sink in a subsequent step. In a case where warpage of the heat sink is corrected before the refrigerant-channel forming casing is firmly fixed to the heat sink, strain concentration can occur at an edge of the joint layer between the ceramic circuit board and the heat sink. This can raise a problem that a period of reliability becomes shorter.

The invention was devised to solve the problem discussed above and has an object to obtain a more reliable semiconductor module.

Solution to Problem

A semiconductor module of the invention includes: a ceramic circuit board having a first conductor layer on a first surface of a ceramic base and a second conductor layer on a second surface of the ceramic base on an opposite side to the first surface; a semiconductor element mounted on the first conductor layer; a heat sink having a third surface and a fourth surface on an opposite side to the third surface, the second conductor layer and the third surface being joined via a joint layer; a fin provided to the fourth surface of the heat sink; and a refrigerant-channel forming casing firmly fixed to the heat sink along a circumferential edge so as to wrap the fin. The semiconductor module is characterized in that the third surface of the heat sink has a convex portion in which a convex plane has an area smaller than a joint area to the joint layer, a first stepped portion provided to an edge of the convex portion, a thickness of the heat sink in a portion corresponding to the first stepped portion being smaller than a thickness of the heat sink in a portion corresponding to the convex portion, and a second stepped portion provided to an edge of the first stepped portion, a thickness of the heat sink in a portion corresponding to the second stepped portion being further smaller than the thickness of the heat sink in the portion corresponding to the first stepped portion, and that the joint layer is joined by the convex portion and the first stepped portion of the heat sink.

An inverter device of the invention is formed by employing the semiconductor module of the invention.

Advantageous Effects of Invention

The invention makes it possible to ease stress applied to an edge of a joint layer when a refrigerant-channel forming casing and a heat sink are firmly fixed. Consequently, a more reliable semiconductor module and a more reliable inverter device can be obtained.

DESCRIPTION OF EMBODIMENTS

First Embodiment

Figure 1A:
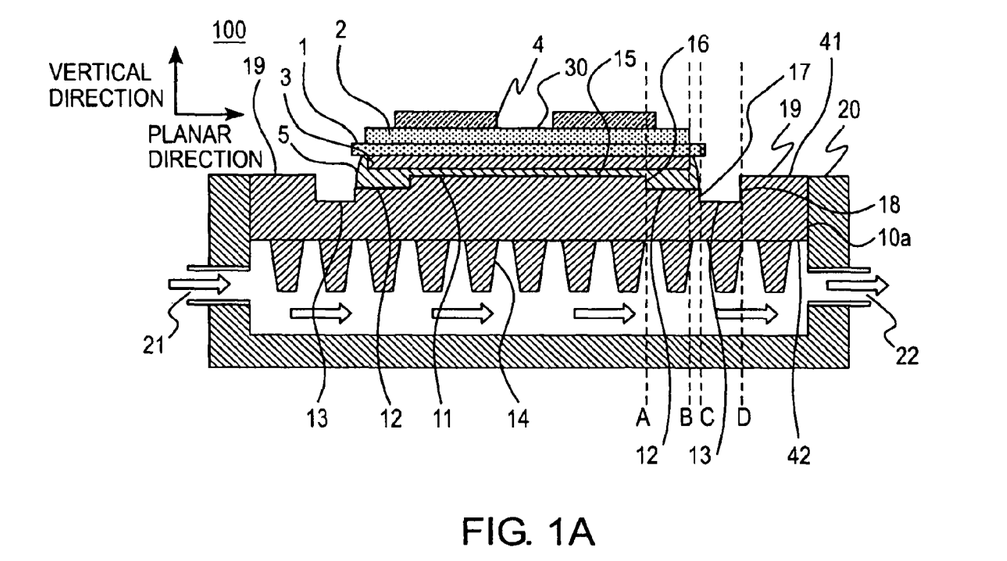
FIG. 1A and FIG. 1B are views showing a semiconductor module according to a first embodiment of the invention.
Figure 1B:
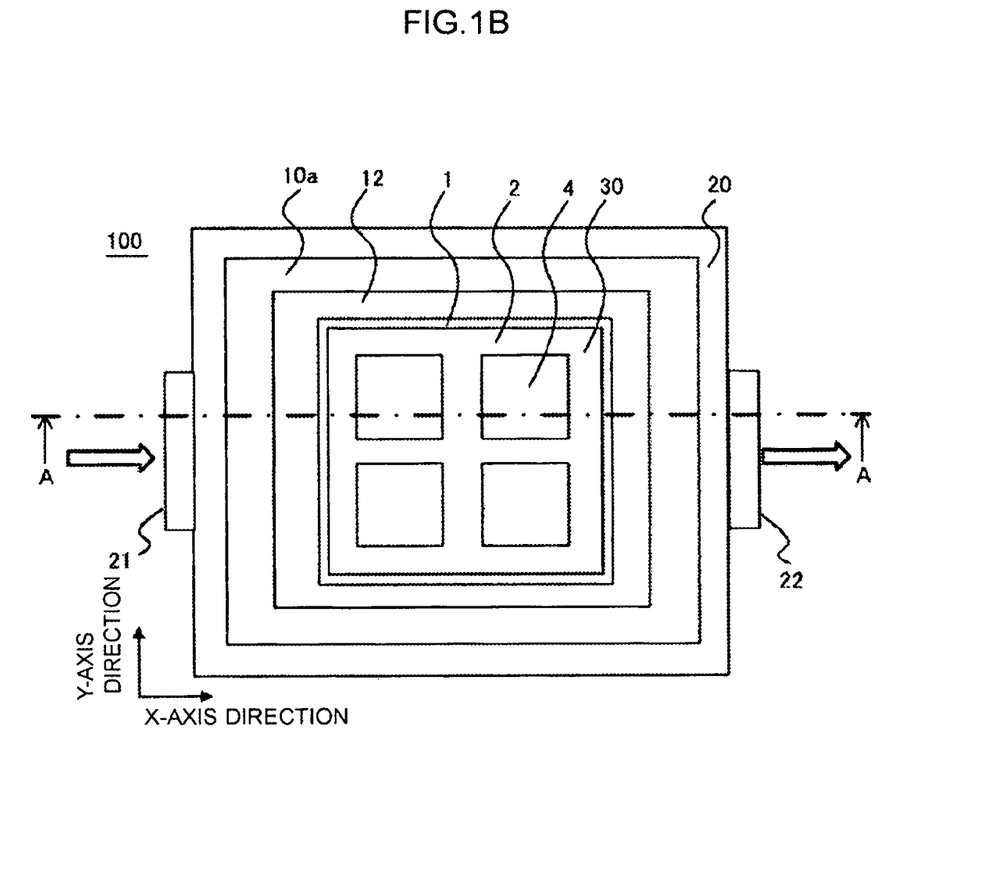

FIG. 1A is a sectional view of a semiconductor module 100 according to a first embodiment. FIG. 1B is a view when the semiconductor module 100 shown in FIG. 1A is viewed from above. FIG. 1A is also a sectional view taken along the line of A-A of FIG. 1B. As are shown in FIG. 1A and FIG. 1B, a ceramic base 1 is provided with a first conductor layer 2 on one surface as a first surface and with a second conductor layer 3 on the other surface as a second surface on the opposite side to the first surface. Hereinafter, the ceramic base 1, the first conductor layer 2, and the second conductor layer 3 are collectively referred to as a ceramic circuit board 30. Semiconductor elements 4 are mounted on the first conductor layer 2 of the ceramic circuit board 30. FIG. 1A and FIG. 1B show a case where four semiconductor elements 4 are mounted.

A heat sink 10a is joined to the second conductor layer 3 of the ceramic circuit board 30 via a joint layer 5, such as solder, which melts at a high temperature and becomes solidified when the temperature is restored to normal temperature. The heat sink 10a has a third surface 41 in contact with the joint layer 5 and a fourth surface 42 on the opposite side to the third surface 41. The third surface 41 of the heat sink 10a on the side in contact with the joint layer 5 is provided with a convex portion 11, a first stepped portion 12, a second stepped portion 13, and a peripheral portion 19.

A plane portion of the convex portion 11 is referred to as a convex plane 15. The convex portion 11 is formed of the convex plane 15 of a square shape and a first step wall surface 16 which is at an edge and perpendicular to the convex plane 15. As is obvious from FIG. 1A and FIG. 1B, the convex portion 11 is inside the joint layer 5 and an area of the convex plane 15 is therefore smaller than a joint area of the joint layer 5 and the third surface 41 of the heat sink 10a. The first stepped portion 12 is a surface provided along the edge of the convex portion 11. A thickness of the heat sink 10a in the first stepped portion 12 is smaller than a thickness of the heat sink 10a in the convex portion 11. In other words, the first stepped portion 12 is a surface provided along the edge of the convex portion 11 and a thickness of the heat sink 10a in a portion corresponding to the first stepped portion 12 is smaller than a thickness of the heat sink 10a in a portion corresponding to the convex portion 11. The second stepped portion 13 is a surface provided along an edge of the first stepped portion 12 with a second step wall surface 17 in between. The second step wall surface 17 is another step wall surface parallel to the first step wall surface 16. A thickness of the heat sink 10a in the second stepped portion 13 is further smaller than the thickness of the heat sink 10a in the first stepped portion 12. In other words, the second stepped portion 13 is a surface provided along the edge of the first stepped portion 12 with the second step wall surface 17 in between, and a thickness of the heat sink 10a in a portion corresponding to the second stepped portion 13 is further smaller than the thickness of the heat sink 10a in the portion corresponding to the first stepped portion 12. The second step wall surface 17 described above is present between a surface of the first stepped portion 12 and a surface of the second stepped portion 13. That is to say, the second step wall surface 17 connects to the edge of the first stepped portion 12 and further the second stepped portion 13 connects to the edge of the second step wall surface 17. It should be noted herein that the joint layer 5 is joined to the convex portion 11 and the first stepped portion 12.

In the heat sink 10a of this embodiment, the peripheral portion 19 is provided along an edge of the second stepped portion 13 with a third step wall surface 18 in between. The third step wall surface 18 is parallel to the first step wall surface 16 and the second step wall surface 17. The peripheral surface 19 is on the same plane as the convex plane 15 and a thickness of the heat sink 10a in a portion corresponding to the peripheral portion 19 is equal to the thickness of the heat sink 10a in the portion corresponding to the convex portion 11. That is to say, the heat sink 10a of this embodiment is provided by cutting out a first groove corresponding to the first stepped portion 12 and a second groove corresponding to the second stepped portion 13 in an Al plate having a predetermined thickness. Hence, a depth of the second groove corresponding to the second stepped portion 13 is larger than a depth of the first groove corresponding to the first stepped portion 12. Herein, the thickness of the heat sink 10a in the portion corresponding to the peripheral portion 19 is equal to the thickness of the heat sink 10a in the portion corresponding to the convex portion 11. It is, however, sufficient that the thickness of the heat sink 10a in the portion corresponding to the peripheral portion 19 is larger than the thickness of the heat sink 10a corresponding to the second stepped portion 13 and may be smaller than the thickness of the heat sink 10a in the portion corresponding to the convex portion 11.

Cooling fins 14 are provided to the fourth surface 42 of the heat sink 10a. In order to let the fins 14 make contact with a liquid coolant as a refrigerant, a water jacket 20, which is a refrigerant-channel forming casing provided with a refrigerant channel in an interior, is firmly fixed along an edge of the heat sink 10a in such a manner so as to wrap the fins 14. The water jacket 20 is provided with an inlet port 21 and an outlet port 22 of the liquid coolant. A flow of the liquid coolant is indicated by arrows in FIG. 1A. The liquid coolant coming inside from the inlet port 21 goes out from the outlet port 22 by passing through the interior of the water jacket 20. The ceramic circuit board 30 is cooled as heat generated in the ceramic circuit board 30 is transmitted to the heat sink 10a and further transmitted from the fins 14 of the heat sink 10a to the refrigerant. In the semiconductor module 100 of this embodiment, the refrigerant flowing through the water jacket 20, which is the refrigerant-channel forming casing, is a liquid coolant and water or an antifreeze liquid is used.

Broken lines A, B, C, and D of FIG. 1A will now be described. The broken line A is a line indicating a position of an edge (first step wall surface 16) of the convex plane 15 in the convex portion 11. The broken line B is a line indicating a position of an edge of the second conductor layer 3. The broken line C is a line indicating a position of the edge (second step wall surface 17) of the first stepped portion 12. The broken line D is a line indicating a position of the edge of the second stepped portion 13. Hence, as is obvious from FIG. 1A, the edge (broken line B) of the second conductor layer 3 is outside the edge (broken line A) of the convex plane 15 in the convex portion 11, the edge (broken line C) of the surface of the first stepped portion 12 is outside the edge (broken line B) of the second conductor layer 3, and the edge (broken line D) of the second stepped portion 13 is outside the edge (broken line C) of the first stepped portion 12.

An example of dimensions of the convex portion 11, the first stepped portion 12, and the second stepped portion 13 of this embodiment will now be described. The edge (broken line A) of the convex plane 15 in the convex portion 11 on all sides in an X-axis direction and a Y-axis direction is 1-mm inside the both edges (broken line C) of the first stepped portion 12, that is, a dimension of the convex plane 15 is made smaller than a dimension of the first stepped portion 12. A height of the convex portion 11 is 1 mm from the surface of the first stepped portion 12. Further, the surface of the second stepped portion 13 provided at the edge (broken line C) of the surface of the first stepped portion 12 on all sides in the X-axis direction and the Y-axis direction is 1-mm outside the both edges (broken line C) of the first stepped portion 12, that is, a dimension of the second stepped portion 13 is made larger than a dimension of the first stepped portion 12. A height of a step wall surface between the first stepped portion 12 and the second stepped portion 13 is 1 mm.

In this embodiment, a distance from the edge (broken line A) of the convex portion 11 to the edge (broken line C) of the first stepped portion 12 and a distance from the edge (broken line C) of the first stepped portion 12 to the edge (broken line D) of the second stepped portion 13 are equal, that is, both distances are 1 mm. It should be appreciated, however, that the two distances are not necessarily equal. The distance from the edge (broken line C) of the first stepped portion 12 to the edge (broken line D) of the second stepped portion 13 may be shorter than the distance from the edge (broken line A) of the convex portion 11 to the edge (broken line C) of the first stepped portion 12. This is because the joint layer 5 is absent in a region from the edge (broken line C) of the first stepped portion 12 to the edge (broken line D) of the second stepped portion 13 and it is sufficient to ease strain concentration occurring due to a correction of warpage when the water jacket 20 and the heat sink 10a are firmly fixed. A stress easing effect is increased by making the convex plane 15 in the convex portion 11 smaller and the convex portion 11 higher. The stress easing effect is increased further by making a distance from the second step wall surface 17 to the edge of the second stepped portion 13 longer and the second step wall surface 17 higher. Furthermore, in order to reduce strain concentration occurring after the joint and applied to the edge of the joint layer 5, it is preferable to make a distance between the edge (broken line A) of the convex plane 15 in the convex portion 11 and the edge (broken line B) of the second conductor layer 3 longer and a distance between the edge (broken line B) of the second conductor layer 3 and the edge (broken line C) of the first stepped portion 12 longer. In order to reduce strain concentration occurring at the edge of the joint layer 5 due to a correction of warpage when the water jacket 20 and the heat sink 10a are firmly fixed, it is preferable to make the thickness of the heat sink 10a in the second stepped portion 13 smaller.

Figure 2A:
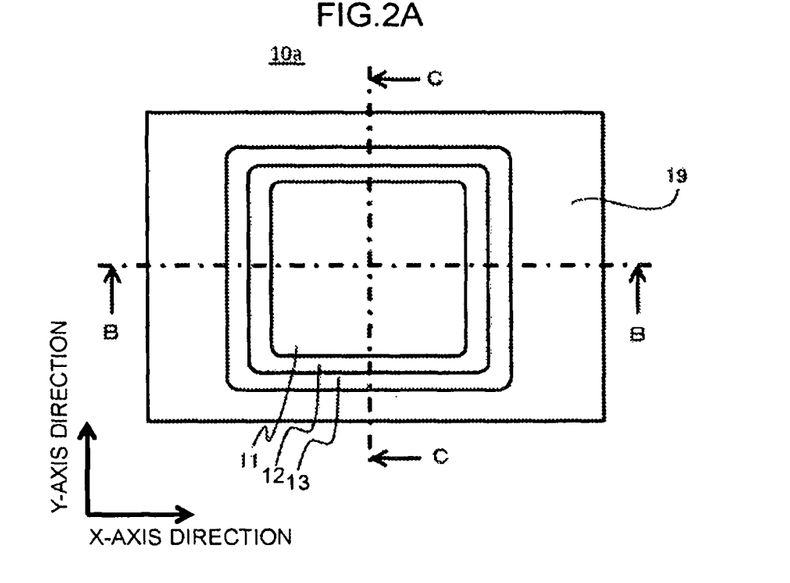
FIG. 2A, FIG. 2B and FIG. 2C are views showing a heat sink of the semiconductor module according to the first embodiment of the invention.
Figure 2B:
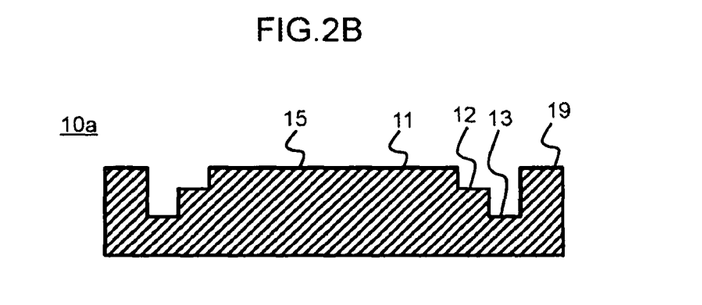
Figure 2C:
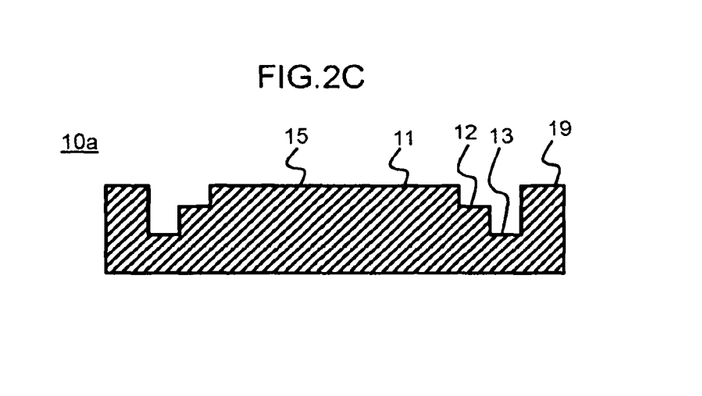

FIG. 2A is a view of the heat sink 10a of the semiconductor module 100 of this embodiment when viewed from above. FIG. 2B is a sectional view taken along the line B-B of FIG. 2A. FIG. 2C is a sectional view taken along the line C-C of FIG. 2A. As is shown in FIG. 2A, corners of the convex portion 11, the first stepped portion 12, and the second stepped portion 13, at which the sides in the X-axis direction and the sides in the Y-axis direction intersect with each other, are shaped like an arc in this embodiment. The purpose of this shape is to increase an effect of easing stress by increasing a thickness of the joint layer 5 at corners where stress concentrates most due to a long joint distance.

In this embodiment, the convex portion 11, the first stepped portion 12, and the second stepped portion 13 are formed by cutting. However, no problem arises when the first stepped portion 12 and the second stepped portion 13 are formed by other methods, such as by molding using a die or by laminating two layers.

In this embodiment, Al is used as a material of the heat sink 10a. However, other materials, such as Cu and Al—SiC, may be used instead. In a case where Al is used as a material of the heat sink 10a and solder is used as a material of the joint layer 5, it is preferable to provide the second stepped portion 13 by cutting or the like after Ni-plating is applied onto the heat sink 10a in which the first stepped portion 12 is already provided by cutting or the like with the aim of enhancing solder wettability. The solder wettability is poor on the second stepped portion 13 provided by cutting or the like after Ni-plating. Hence, a shape of the joint layer 5 can be readily controlled and the joint layer 5 of a satisfactory shape can be formed.

The following will describe in detail a case where solder is used as a material of the joint layer 5 by way of example and the solder is supplied to the third surface 41 of the heat sink 10a by screen printing. The supply method is not particularly limited and solder may be also supplied using a dispenser, an ink-jet method, or a solder sheet. In this embodiment, an amount of supply is adjusted so that a solder height is 0.3 mm on average after solder joint is performed. It goes without saying that the material of the joint layer 5 is not limited to solder and can be any material that can be joined by melting at a high temperature and becoming solidified when the temperature is restored to normal temperature. A member used for the joint layer 5 may not be solder. For example, Ag paste or a conductive adhesive may be used instead. When solder made of lead-free solder is used as a material of the joint layer 5, a greater stress easing effect can be obtained by using the invention because lead-free solder has a high melting point and greater strain is applied to the edge of the joint layer 5 when the temperature is restored to normal temperature after the joint.

Strain concentration occurring at the edge of the joint layer 5 when the temperature is restored to normal temperature after the ceramic circuit board 30 provided with the semiconductor elements 4 is joined to the heat sink 10a at a high temperature becomes larger as a difference between a linear expansion coefficient of the ceramic circuit board 30 and a linear expansion coefficient of the heat sink 10a becomes larger, and also as the thickness of the joint layer 5 becomes smaller. In this embodiment, the convex portion 11, the first stepped portion 12, and the second stepped portion 13 are provided, and the joint layer 5 is joined to the convex portion 11 and the first stepped portion 12 of the heat sink 10a. Meanwhile, although the mechanism will be described below, the joint layer 5 is not joined to the second stepped portion 13. Consequently, it is configured in such a manner that a thickness of the joint layer 5 at a position corresponding to the first stepped portion 12 of the heat skin 10a becomes larger than a thickness of the joint layer 5 at a position corresponding to the convex plane 15 in the convex portion 11 of the heat sink 10a. Owing to this configuration, a function to enhance the reliability of the joint layer 5 is exerted. In particular, the stress easing effect can be obtained further by making the corners of the first stepped portion 12 in the shape of an arc.

In a case where solder is used for the joint layer 5, Cu is used for the first conductor layer 2 and the second conductor layer 3, and Al is used for the heat sink 10a, a thermal conductivity of Cu used for the first conductor layer 2 and the second conductor layer 3 is about 400 W/mK, which is relatively a high value in comparison with a thermal conductivity (about 200 W/mK) of Al used for the heat sink 10a. In contrast, a thermal conductivity of solder made into the joint layer 5 is normally smaller than thermal conductivities of Cu and Al and as small as about 50 W/mk. Hence, although the joint layer 5 is made of metal, there is a problem that the joint layer 5 increases thermal resistance from the semiconductor elements 4 to the heat sink 10a when the joint layer 5 is thick. However, in the step of restoring the temperature to normal temperature from a high temperature at the time of joint, heat is released more and therefore the temperature readily drops in the vicinity of the first stepped portion 12 on the periphery of the convex portion 11 of the heat sink 10a than in the vicinity of the convex portion 11. Hence, in order to lower the temperature homogeneously across the entire joint layer 5, as has been described, it is preferable to configure in such a manner that a thickness of the joint layer 5 at the position corresponding to the convex plane 15 in the convex portion 11 of the heat sink 10a where the temperature becomes high is made smaller than a thickness of the joint layer 5 at the position corresponding to the first stepped portion 12 of the heat sink 10a. By configuring as above, a temperature difference across the joint layer 5 between the vicinity of the convex portion 11 and the vicinity of the first stepped portion 12 on the periphery of the convex portion 11 can be controlled so as not to increase. Hence, stress can be eased and higher reliability can be achieved.

In this embodiment, when the ceramic circuit board 30 and the heat sink 10a are joined using solder as the joint layer 5, solder joint is performed by placing the ceramic circuit board 30 provided with the semiconductor elements 4 on the third surface of the heat sink 10a where solder is supplied, and by heating solder to 250° C. by performing solder reflow. According to this embodiment, although the mechanism will be described below, a fillet of the joint layer 5 after the solder joint is maintained on the surface of the first stepped portion 12 and solder does not flow out onto the surface of the second stepped portion 13. Hence, solder resist or the like is no longer necessary when the ceramic circuit board 30 and the heat sink 10a are joined. Consequently, there can be obtained an effect that the fabrication sequence becomes easier.

The reason why it is not necessary to provide solder resist to the heat sink 10a in this embodiment will now be described. In this embodiment, an angle which the surface of the first stepped portion 12 forms with the second step wall surface 17 is 90 degrees. In other words, at the edge of the first stepped portion 12, 90 degrees is added to an angle of contact of the joint layer 5 in comparison with that on the surface of the first stepped portion 12. Accordingly, solder does not flow out to the second stepped portion 13 until an angle of contact of the joint layer 5 reaches an angle of contact at the edge of the first stepped portion 12 plus 90 degrees. The fillet of the joint layer 5 is thus maintained at the edge of the first stepped portion 12. For example, assume that the joint layer 5 becomes wet and spreads when an angle of contact between the joint layer 5 and the heat sink 10a becomes 30 degrees or higher. Then, the joint layer 5 becomes wet and spreads on the surface of the first stepped portion 12 when an angle of contact is 30 degrees or higher. In contrast, at the edge of the first stepped portion 12, the joint layer 5 cannot become wet and spread over the edge of the first stepped portion 12 unless an angle of contact is 120 degrees or higher. It should be noted that by setting an angle which the surface of the first stepped portion 12 forms with the second step wall surface 17 to 90 degrees or higher, a higher effect can be obtained from the viewpoint of maintaining a shape of the fillet of the joint layer 5.

As the shape of the fillet of the joint layer 5 becomes smoother, a local increase in amount of strain of the joint layer 5 can be prevented more. Hence, according to this embodiment, because the joint layer 5 of a stable shape can be formed automatically, a guarantee period of reliability of the semiconductor module 100 can be extended.

Figure 3:
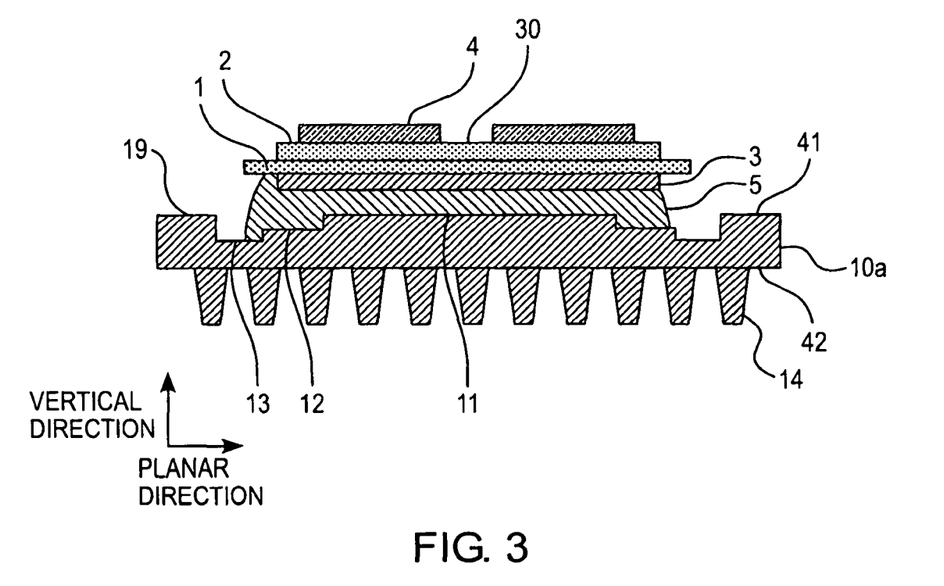
FIG. 3 is a view showing a ceramic circuit board and the heat sink of the semiconductor module according to the first embodiment of the invention.

FIG. 3 is a sectional view showing another example of a joint state of the ceramic circuit board 30 and the heat sink 10a of this embodiment. The most preferable joint state of the ceramic circuit board 30 and the heat sink 10a is the state shown in FIG. 1A in which the joint layer 5 spreads to the edge of the first stepped portion 12. However, the joint layer 5 may not spread to the edge of the first stepped portion 12 as shown in FIG. 3 because of a variance in supplied amount of the joint layer 5. However, no problem arises unless there is an incident such that no solder is present in the first stepped portion 12, and the effect of the invention can be obtained as well. Also, there may be a case where the joint layer 5 spreads to the second step wall surface 17 or the second stepped portion 13 over the first stepped portion 12. In this case, too, no problem arises unless solder spreads across the entire second stepped portion 13, and the effect of the invention can be obtained as well.

Figure 4:
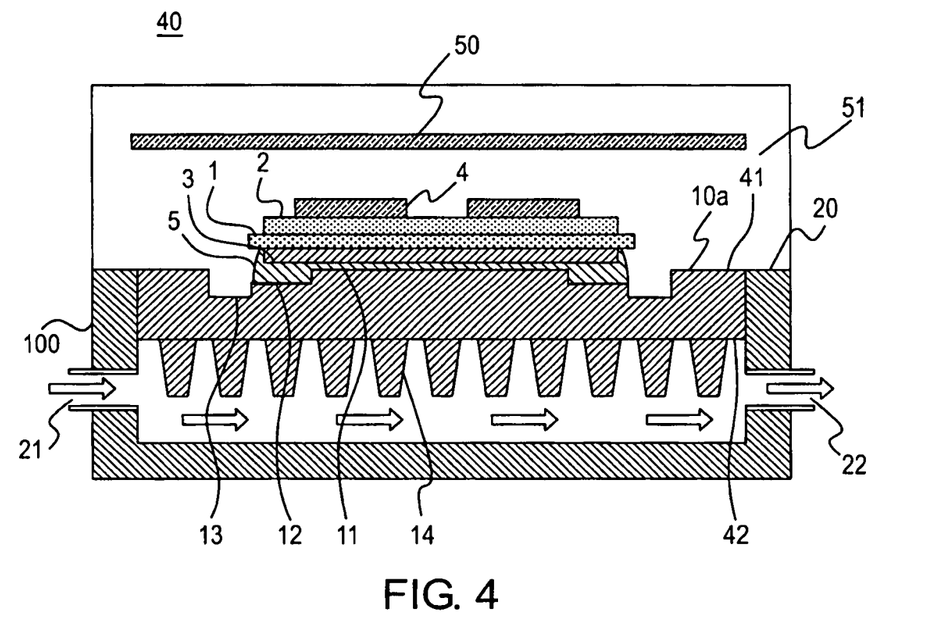
FIG. 4 is a view showing an inverter device employing the semiconductor module according to the first embodiment of the invention.

FIG. 4 is a sectional view of an inverter device 40 incorporating the semiconductor module 100 of this embodiment. Referring to FIG. 4, an inverter device 40 is formed by integrally encapsulating the semiconductor module 100 of this embodiment and a control board 50 with mold resin 51. By incorporating the semiconductor module 100 of this embodiment into the inverter device 40, reliability of the inverter device 40 can be enhanced.

Figure 5:
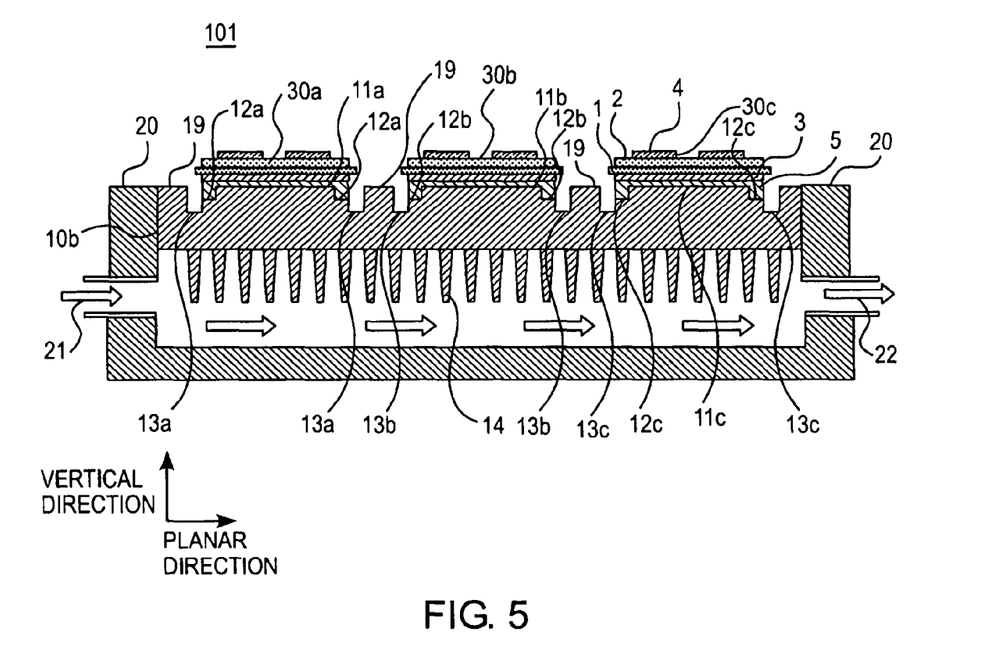
FIG. 5 is a view showing a semiconductor module having multiple ceramic circuit boards as a modification of the first embodiment of the invention.

A modification of this embodiment will now be described. FIG. 5 is a sectional view of a modification, namely a semiconductor module 101 having multiple ceramic circuit boards 30a, 30b, and 30c each provided with the semiconductor elements 4. FIG. 5 shows a case where four semiconductor elements 4 are mounted on each of the ceramic circuit boards 30a, 30b, and 30c as in FIG. 1A and FIG. 1B. In the modification of this embodiment, as is shown in FIG. 5, three ceramic circuit boards 30a, 30b, and 30c disposed next to each other are joined to a single heat sink 10b. Arrows of FIG. 5 indicate a flow of a liquid coolant as in FIG. 1B. In the heat sink 10b shown in FIG. 5, convex portions 11a, 11b, and 11c are provided so as to correspond to the ceramic circuit boards 30a, 30b, and 30c, respectively. Also, first stepped portions 12a, 12b, and 12c and second stepped portions 13a, 13b, and 13c are provided at the peripheries of the convex portions 11a, 11b, and 11c, respectively. That is to say, the heat sink 10b is provided by cutting out a first groove corresponding to the first stepped portion 12 and a second groove corresponding to the second stepped portion 13 in an Al plate having a predetermined thickness. The peripheral portion 19 is provided along the edge of the stepped portion 13a corresponding to the ceramic circuit board 30a, along the edge of the stepped portion 13b corresponding to the ceramic circuit board 30b, and along the edge of the stepped portion 13c corresponding to the ceramic circuit board 30c. In other words, the peripheral portion 19 on the same plane as the convex portions 11a, 11b, and 11c is provided between the second stepped portion 13a corresponding to the ceramic circuit board 30a and the second stepped portion 13b corresponding to the ceramic circuit board 30b, and the peripheral portion 19 is provided between the second stepped portion 13b corresponding to the ceramic circuit board 30b and the second stepped portion 13c corresponding to the ceramic circuit board 30c. When the temperature is restored to normal temperature from a high temperature at the time of joint of the ceramic circuit boards 30a, 30b, and 30c, large warpage occurs in the heat sink 10b because the number of the ceramic circuit boards 30a, 30b, and 30c is large. However, even in a case where welding is applied when firmly fixing the heat sink 10b in which large warpage is occurring and the water jacket 20 while the warpage is corrected using a pressure tool, compression stress generated at the edge of the joint layer 5 is absorbed into the second stepped portions 13a, 13b, and 13c. Hence, reliability of the semiconductor module 101 can be enhanced.

As has been described, the semiconductor module according to the first embodiment of the invention includes: a ceramic circuit board having a first conductor layer on a first surface of a ceramic base and a second conductor layer on a second surface of the ceramic base on an opposite side to the first surface; a semiconductor element mounted on the first conductor layer; a heat sink having a third surface 41 and a fourth surface 42 on an opposite side to the third surface 41, the second conductor layer and the third surface 41 being joined via a joint layer; a fin provided to the fourth surface 42 of the heat sink; and a refrigerant-channel forming casing firmly fixed to the heat sink along a circumferential edge so as to wrap the fin. The third surface 41 of the heat sink has a convex portion in which a convex plane has an area smaller than a joint area to the joint layer, a first stepped portion provided to an edge of the convex portion, a thickness of the heat sink in a portion corresponding to the first stepped portion being smaller than a thickness of the heat sink in a portion corresponding to the convex portion, and a second stepped portion provided to an edge of the first stepped portion, a thickness of the heat sink in a portion corresponding to the second stepped portion being further smaller than the thickness of the heat sink in the portion corresponding to the first stepped portion. The joint layer is joined by the convex portion and the first stepped portion of the heat sink. Owing to the configuration as above, a stress applied to the edge of the joint layer when firmly fixing the refrigerant-channel forming casing and the heat sink can be eased. Hence, a more reliable semiconductor module can be obtained. Also, by forming an inverter device by employing the semiconductor module according to the first embodiment of the invention, reliability of the inverter device can be enhanced.

Second Embodiment

Figure 6A:
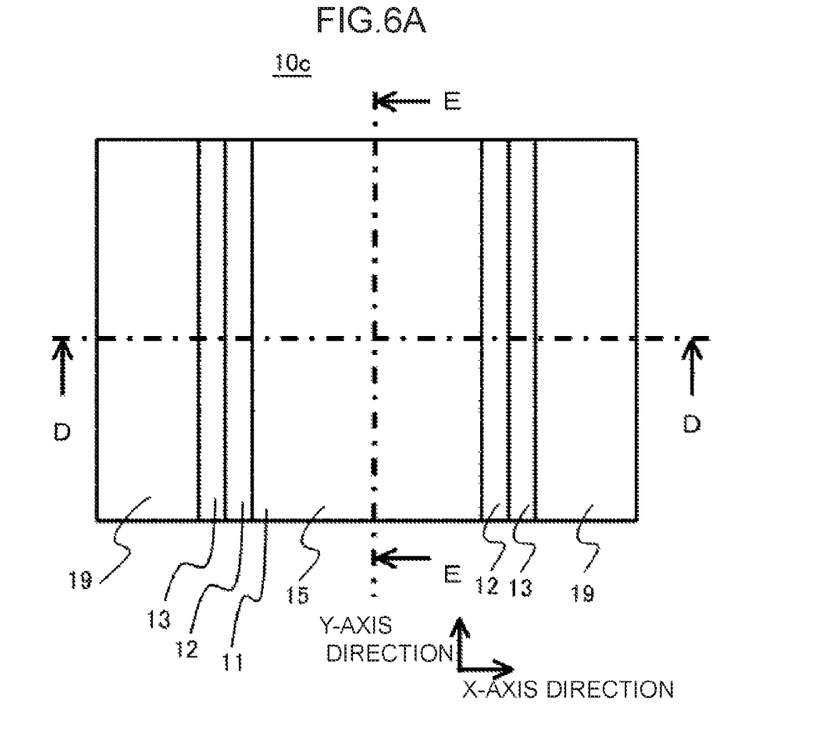
FIG. 6A, FIG. 6B and FIG. 6C are views showing a heat sink of a semiconductor module according to a second embodiment of the invention.
Figure 6B:
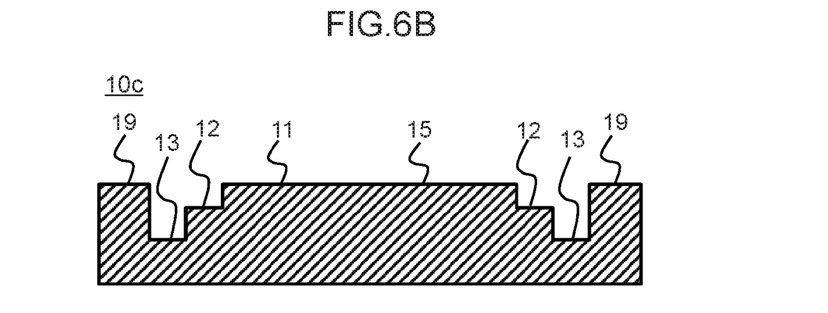
Figure 6C:
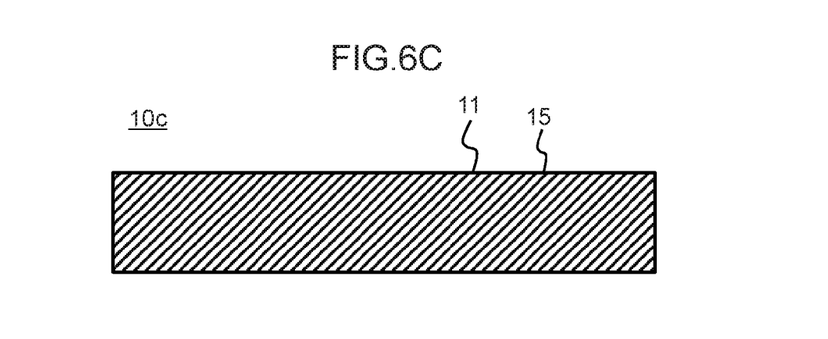

FIG. 6A is a view showing a heat sink 10*c* of a second embodiment when viewed from above. FIG. 6B is a sectional view taken along the line D-D of FIG. 6A. FIG. 6C is a sectional view taken along the line E-E of FIG. 6A. In the heat sinks 10*a* and 10*b* of the first embodiment above, the first stepped portion 12 and the second stepped portion 13 are provided on the outside of the four sides of the square convex plane 15 in the convex portion 11. In the heat sink 10*c* of this embodiment, a first stepped portion 12, a second stepped portion 13, and a peripheral portion 19 are provided on the outside of opposing two sides out of four sides of a square convex plane 15 in a convex portion 11 whereas the first stepped portion 12, the second stepped portion 13, and the peripheral portion 19 are not provided on the outside of the remaining opposing two sides. In other words, the heat sink 10*c* is provided by cutting out a first groove corresponding to the first stepped portion 12 and a second groove corresponding to the second stepped portion 13 in an Al plate having a predetermined thickness on the outside of only opposing two sides out of four sides of the square convex plane 15 in the convex portion 11. FIG. 6A, FIG. 6B and FIG. 6C show the heat sink 10*c* in a case where the first stepped portion 12, the second stepped portion 13, and the peripheral portion 19 are provided on the outside of opposing two sides of the square convex plane 15 which are parallel to a Y-axis direction, and the first stepped portion 12, the second stepped portion 13, and the peripheral portion 19 are not provided on the outside of opposing two sides which are parallel to an X-axis direction. A semiconductor module of this embodiment is the same as the semiconductor module 100 of the first embodiment above except for the structure of the heat sink 10*c*. According to the semiconductor module having the heat sink 10*c*, the first stepped portion 12 and the second stepped portion 13 are provided on the outside of only the two sides of the convex plane 15 which extend in a direction orthogonal to a direction in which warpage becomes large when the temperature is restored to normal temperature after the ceramic circuit board 30 provided with the semiconductor elements 4 is joined at a high temperature. Owing to this configuration, a guarantee period of reliability of the semiconductor module having the heat sink 10*c* can be extended further.

In this embodiment, the first stepped portion 12, the second stepped portion 13, and the peripheral portion 19 are provided on the outside of only opposing two sides out of the four sides of the square convex plane 15 in the convex portion 11. Hence, the heat sink 10*c* can be provided by extrusion. Consequently, the semiconductor module of this embodiment can obtain an effect that the semiconductor module can be manufactured and assembled more easily.

As has been described, according to the semiconductor module of the second embodiment, the first stepped portion and the second stepped portion are provided on the outside of only opposing two sides out of the four sides of the square convex plane in the convex portion. Owing to this configuration, reliability of the semiconductor module having the heat sink can be enhanced further. Also, according to the semiconductor module of the second embodiment, the heat sink can be configured to be provided by extrusion. Hence, there can be obtained an effect that the semiconductor module can be manufactured and assembled more easily.

Third Embodiment

Figure 7A:
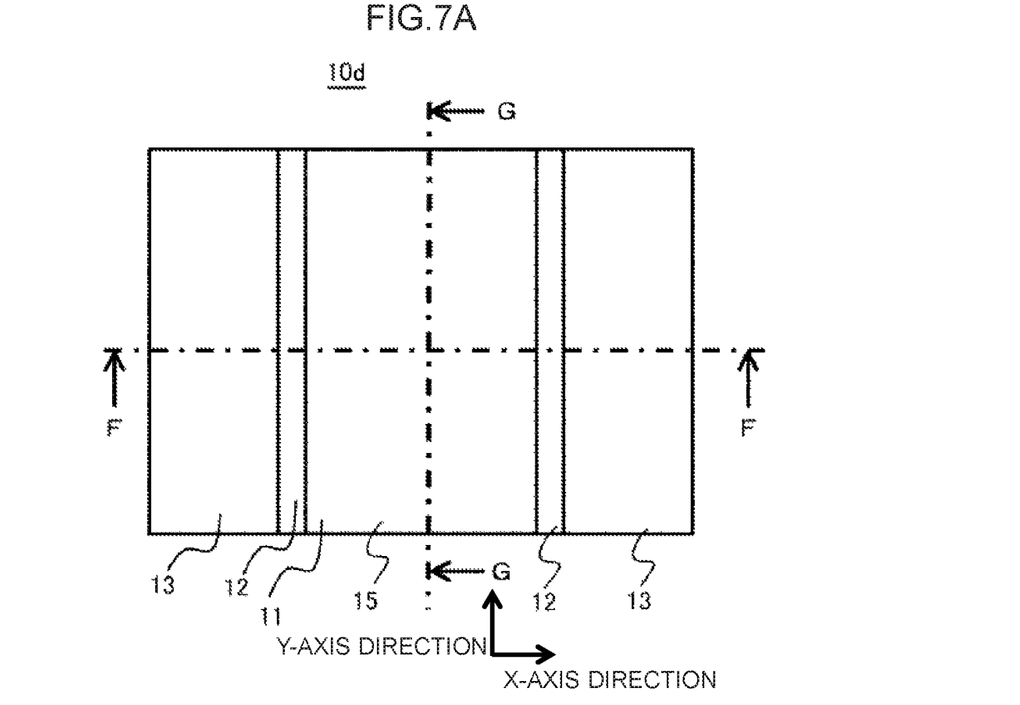
FIG. 7A, FIG. 7B and FIG. 7C are views showing a heat sink of a semiconductor module according to a third embodiment of the invention.
Figure 7B:
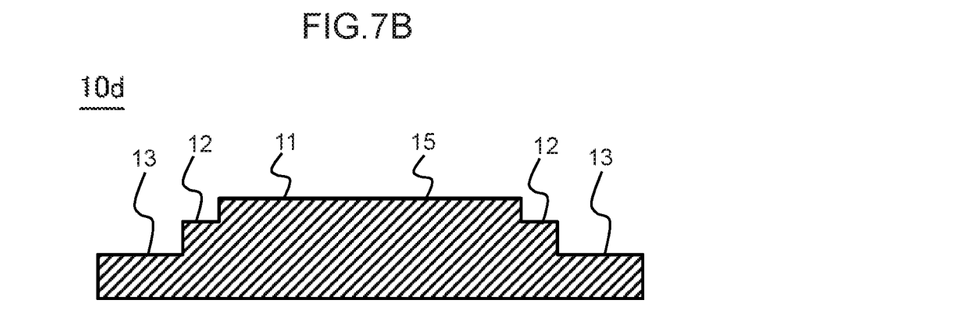
Figure 7C:
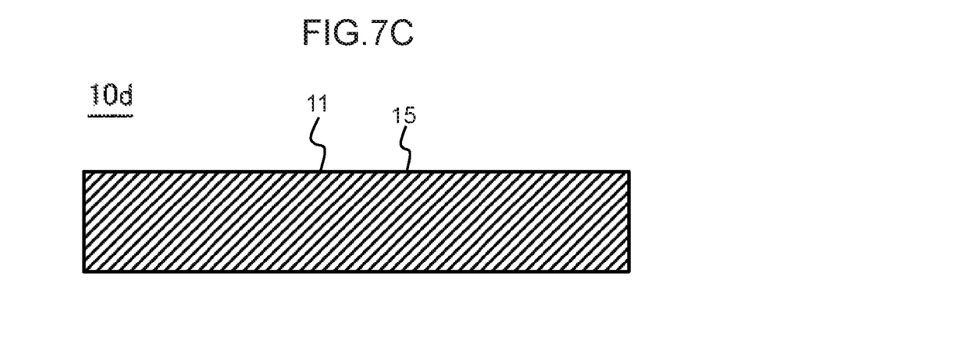

FIG. 7A is a view showing a heat sink 10*d* of a third embodiment when viewed from above. FIG. 7B is a sectional view taken along the line F-F of FIG. 7A. FIG. 7C is a sectional view taken along the line G-G of FIG. 7A. In the heat sink 10*d* of this embodiment, a first stepped portion 12 and a second stepped portion 13 are provided on the outside of only opposing two sides out of four sides of a square convex plane 15 in a convex portion 11 whereas the first stepped portion 12 and the second stepped portion 13 are not provided outside the remaining opposing two sides. In other words, the heat sink 10*d* is provided by cutting out a first groove corresponding to the first stepped portion 12 and a second groove corresponding to the second stepped portion 13 in an Al plate having a predetermined thickness on the outside of only opposing two sides out of the four sides of the square convex plane 15 in the convex portion 11. FIG. 7A, FIG. 7B and FIG. 7C show a case where the first stepped portion 12 and the second stepped portion 13 are provided on the outside of opposing two sides of the square convex plane 15 which are parallel to a Y-axis direction. The heat sink 10*d* of this embodiment is different from the heat sink 10*c* of the second embodiment above in that the peripheral portion 19 is not provided on the outside of the edge of the second stepped portion 13. The other structure is the same as the structure of the semiconductor module of the second embodiment above. As in the second embodiment above, according to the semiconductor module having the heat sink 10*d*, the first stepped portion 12 and the second stepped portion 13 are provided on the outside of only the two sides of the convex plane 15 which extend in a direction orthogonal to a direction in which warpage becomes large when the temperature is restored to normal temperature after the ceramic circuit board 30 provided with semiconductor elements 4 is joined at a high temperature. Owing to this configuration, a guarantee period of reliability of the semiconductor module having the heat sink 10*d* can be extended further.

In this embodiment, the first stepped portion 12 and the second stepped portion 13 are provided on the outside of only the opposing two sides out of the four sides of the square convex plane 15 in the convex portion 11. Hence, the heat sink 10*d* can be provided by extrusion instead of cutting. Consequently, the semiconductor module of this embodiment can obtain an effect that the semiconductor module can be manufactured and assembled more easily.

As has been described, according to the semiconductor module of the third embodiment, the first stepped portion and the second stepped portion are provided on the outside of only opposing two sides out of four sides of the square convex plane in the convex portion 11. Owing to this configuration, reliability of the semiconductor module having the heat sink can be enhanced further. Also, according to the semiconductor module of the third embodiment, the heat sink can be configured to be provided by extrusion. Hence, there can be obtained an effect that the semiconductor module can be manufactured and assembled more easily.

The heat sink 10d of the third embodiment is different from the heat sink 10c of the second embodiment above in that the peripheral portion 19 is not provided on the outside of the edge of the second stepped portion 13. The heat sink 10a or 10b of the first embodiment above may be also configured in such a manner that the peripheral portion 19 is not provided on the outside of the second stepped portion 13.

In the semiconductor modules of the first through third embodiments above, a liquid coolant is used as the refrigerant flowing through the interior of the refrigerant-channel forming casing. It should be appreciated, however, that the refrigerant is not necessarily a liquid and may be a gas, such as air.

It should be appreciated that the embodiments of the invention can be combined without any restriction or the respective embodiments can be modified or omitted as needed within the scope of the invention.

REFERENCE SIGNS LIST

1: ceramic base, 2: first conductor layer, 3: second conductor layer, 4: semiconductor element, 10a: heat sink, 10b: heat sink, 10c: heat sink, 10d: heat sink, 11: convex portion, 11a: convex portion, 11b: convex portion, 11c: convex portion, 12: first stepped portion, 12a: first stepped portion, 12b: first stepped portion, 12c: first stepped portion, 13: second stepped portion, 13a: second stepped portion, 13b: second stepped portion, 13c: second stepped portion 14: fin, 15: convex plane, 16: first step wall surface, 17: second step wall surface, 18: third step wall surface, 19: peripheral portion, 20: water jacket, 30: ceramic circuit board, 30a: ceramic circuit board, 30b: ceramic circuit board, 30c: ceramic circuit board, 40: inverter device, 50: control board, 51: mold resin, 100: semiconductor module, and 101: semiconductor module

The invention claimed is:

1. A semiconductor module, comprising:
a ceramic circuit board having a first conductor layer on a first surface of a ceramic base and a second conductor layer on a second surface of the ceramic base on an opposite side to the first surface;
a semiconductor element mounted on the first conductor layer;
a heat sink having a third surface and a fourth surface on an opposite side to the third surface, the second conductor layer and the third surface being joined via a joint layer;
a fin provided to the fourth surface of the heat sink; and
a refrigerant-channel forming casing firmly fixed to the heat sink along a circumferential edge so as to wrap the fin, wherein:
the third surface of the heat sink has,
a convex portion in which a convex plane has an area smaller than a joint area to the joint layer,
a first stepped portion provided to an edge of the convex portion, a thickness of the heat sink in a portion corresponding to the first stepped portion being smaller than a thickness of the heat sink in a portion corresponding to the convex portion, and
a second stepped portion provided to an edge of the first stepped portion, a thickness of the heat sink in a portion corresponding to the second stepped portion being further smaller than the thickness of the heat sink in the portion corresponding to the first stepped portion;
the joint layer is joined to the convex portion and the first stepped portion of the heat sink and joined to the second stepped portion while a surface of the second stepped portion is exposed partially; and
an edge of the second conductor layer is encapsulated with the joint layer and the second stepped portion is directly adjacent to the first stepped portion.

2. The semiconductor module according to claim 1, wherein:
corners of the convex plane in the convex portion and corners of the first stepped portion are of an arc shape.

3. The semiconductor module according to claim 1, wherein:
the first stepped portion and the second stepped portion are provided on only two opposite sides out of four sides of the convex plane of a square shape in the convex portion.

4. The semiconductor module according to claim 1, wherein:
an angle which a second step wall surface between the first stepped portion and the second stepped portion forms with a surface of the first stepped portion is between 90 degrees and less than 180 degrees.

5. The semiconductor module according to claim 1, wherein:
the edge of the second conductor layer is disposed outside an edge of the convex plane in the convex portion;
an edge of a surface of the first stepped portion is disposed outside the edge of the second conductor layer; and
an edge of a surface of the second stepped portion is disposed outside the edge of the surface of the first stepped portion.

6. The semiconductor module according to claim 1, wherein:
a peripheral portion is provided to an edge of the second stepped portion; and
a thickness of the heat sink in a portion corresponding to the peripheral portion is equal to a thickness of the heat sink in a portion corresponding to the convex portion.

7. An inverter device, comprising:
the semiconductor module set forth in claim 1.

* * * * *